United States Patent [19]

Minner et al.

[11] 4,195,314

[45] Mar. 25, 1980

[54] TUNING CIRCUIT FOR HIGH FREQUENCY RECEIVING APPARATUS WITH RESIDUAL SIDEBAND MODULATION, ESPECIALLY FOR TELEVISION RECEIVERS

[75] Inventors: Willy Minner, Schwaigern; Paul Sieber; Ibolya Haraszti, both of Heilbronn, all of Fed. Rep. of Germany

[73] Assignee: Licentia Patent-Verwaltungs-G.m.b.H., Frankfurt am Main, Fed. Rep. of Germany

[21] Appl. No.: 898,867

[22] Filed: Apr. 21, 1978

[30] Foreign Application Priority Data

May 5, 1977 [DE] Fed. Rep. of Germany ....... 2720170

[51] Int. Cl.² .............................................. H04N 5/44
[52] U.S. Cl. .................................... 455/185; 455/204
[58] Field of Search ....................... 358/191, 193, 195

[56] References Cited

U.S. PATENT DOCUMENTS

| | | |
|---|---|---|
| 4,038,689 | 7/1977 | Rzeszewski et al. ............... 358/191 |
| 4,127,822 | 11/1978 | Mogi et al. ........................ 358/191 |
| 4,128,849 | 12/1978 | Rhee .................................. 358/191 |

Primary Examiner—Richard Murray
Attorney, Agent, or Firm—Spencer & Kaye

[57] ABSTRACT

A tuning circuit for tuning a high frequency receiving apparatus with residual sideband modulation, especially a television receiver, with a counter for forming encoded values of tuning voltage, with a store for the digital storing of the encoded values of tuning voltage, with a D/A converter for generating the analog tuning voltages from the encoded values and with a circuit for automatic fine tuning to the required position of a received transmitter. In such tuning circuit means are provided which so alter the value of the tuning voltage before or during writing into the store or after or during reading out from the store that this value corresponds not to the required tuning position but to a tuning position shifted into the fully transmitted sideband. The exact tuning ot the transmitter to the required position is effected by the circuit for fine tuning.

8 Claims, 5 Drawing Figures

TUNING CIRCUIT FOR HIGH FREQUENCY RECEIVING APPARATUS WITH RESIDUAL SIDEBAND MODULATION, ESPECIALLY FOR TELEVISION RECEIVERS

BACKGROUND OF THE INVENTION

The invention relates to a tuning circuit of the type described in the periodical "Funkschau" 1976, volume 5, pages 166 et seq.

In this known tuning circuit, in addition to the means for digitally controlled turning, a circuit operating in analog manner is provided for automatic fine tuning (AFC circuit).

In circuits for automatic fine tuning of a receiver with residual sideband modulation, e.g. for a television receiver, quite different conditions obtain from those with a radio receiver which is suitable for the reception of transmitted signals in which both sidebands are transmitted. The received carrier does not lie at the middle of the selection curve. From this there results an asymmetrical capturing and holding range of the AFC circuit (See Funkschau 1959, volume 20, page 489).

In the digital storing of encoded values of tuning voltage and the obtaining of the related direct tuning voltage by means of a digital/analog converter (D/A converter), the problem exists that after a certain time the value of direct voltage adjusted with a definite code word may deviate from the original value owing to drift phenomena. This is e.g. the case when the value with the apparatus warmed up is stored and the stored value has to be adjusted again with the apparatus cooled down. Since the range of capture of the AFC circuit in one direction is relatively small there is the danger that upon a drift in this direction the transmitter associated with the stored code word is no longer identified and captured. Upon a drift in the other direction the capturing range of the AFC circuit, in contrast, has a sufficiently large reserve.

This danger is increased further when in the storing of the values of the tuning voltage it is not the value corresponding to exact tuning that is stored but an optimum value in accordance with the subjective impression of the operator, which value is only a little way from the limit of the capturing range of the AFC circuit. Such a desired wrong tuning is possible when the frequency discriminator of the AFC circuit is adversely affected by an additionally stored code word.

SUMMARY OF THE INVENTION

The invention is based on the problem of providing a tuning circuit with which the danger does not arise that with the stored encoded value of tuning voltage the associated transmitter can no longer be captured.

According to the invention, there are provided digital circuit means which so alter the value of the tuning voltage before or during writing into the store or after or during reading out from the store that this value corresponds not to the required tuning position but to a tuning position shifted into the fully transmitted sideband. The exact tuning of the transmitter to the required position is effected by the circuit for fine tuning.

BRIEF DESCRIPTION OF THE DRAWINGS

The invention is explained below with reference to various practical forms which are illustrated in the drawing.

DESCRIPTION OF THE PREFERRED EMBODIMENTS

Figure 2:
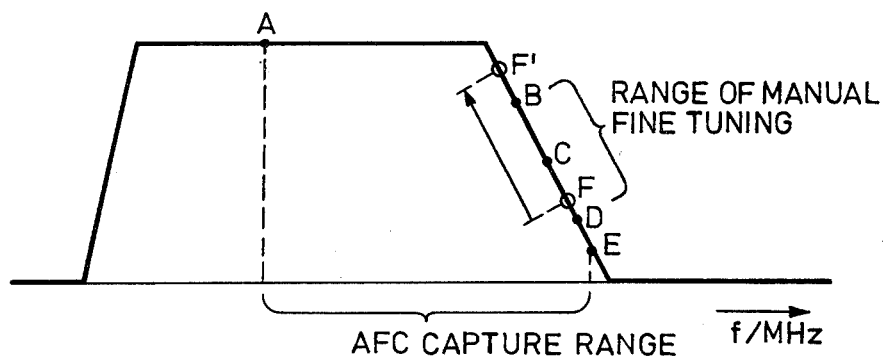
FIG. 2 shows the IF pass curve of a television apparatus for explaining the operation of the invention.

First there will be explained, with reference to FIG. 2, in which the pass curve of the intermediate frequency amplifier of a television apparatus is illustrated, how the capturing range of an AFC circuit of a television apparatus for example can be located. As an example, individual frequency values A to F are marked. The frequency values associated with these points in the IF range are given in brackets in the text. The point C (38.9 MHz) corresponds to exact tuning to a transmitter. The carrier of the received transmitter lies at this point. With a deviation of the position of the carrier from the point C to the left into the pass range of the IF amplifier the AFC circuit is capable of capturing the transmitter as far as a point A (35:9 to 36:9 MHz) i.e. of shifting the intermediate frequency carrier to the point C by AFC regulation. The capturing range extends to the right, in contrast, only to the point E (39.55 MHz) and is therefore appreciably smaller than to the left. Within a range limited by the points B and D fine tuning of the transmitter can be effected by tuning the reference circuit of the AFC circuit. The transmitter is then regulated not to the point C but to a definite point determined by the fine tuning, for example the point F. In the most unfavorable case, which occurs when tuning has been effected to the point D, the tuning point is displaced by only 200 kHz from the limit of the capturing range, based on the values given in brackets. The distance from the limit A, in contrast, is more than 2 MHz. The amount 200 kHz is easily exceeded by drift phenomena during the storing of transmitter signals which has the effect that a stored transmitter signal can no longer be captured.

By further means described below, the selection of a transmitter tuning is effected not to the point F which corresponds to the required position of the carrier, but to a point F'. The point F' is located so far from the limit E of the capturing range of the AFC circuit that the danger that the transmitter cannot be captured is eliminated. This shifting also ensures that tuning is effected by the AFC circuit to the required point F, which corresponds to the required position.

Figure 1:
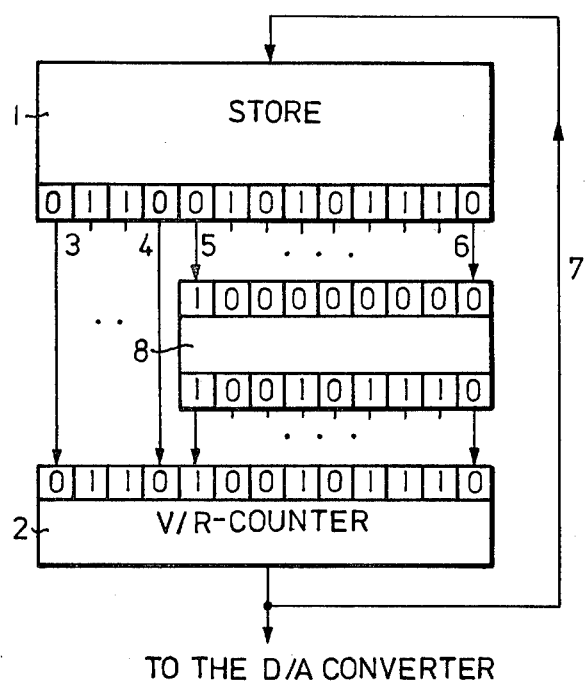
FIG. 1 shows part of a digital tuning circuit having the features according to the invention, the means being formed by a binary subtracter.

In the following, several practical examples of the invention are described. In FIG. 1 is illustrated part of a digital tuning circuit which includes as a central component a forward-reverse counter 2. The outputs of the counting stages of the counter 2 are connected to a digital/analog converter (D/A converter) not illustrated. There may be used for example a D/A converter in accordance with German Offenlegungsschrift 25 31 945.3. By means of the D/A converter a value of direct tuning voltage is derived from the counting state of the counter 2. The counting state may be varied by counting pulses in the forward or reverse direction for tuning.

The counting state related to a tuned transmitter can be written into a store 1 and stored. The stored code word may be recalled at any time. It is then transmitted back again to the counter 2 and thereby determines the analog value of direct tuning voltage at the output of the D/A converter. With this tuning circuit there is a mutual fixed relationship between a value of direct voltage and the code word stored or located in the counter 2, which however may be adversely affected in the D/A converter by drift phenomena, such as ageing of components and temperature drift. The construction of the digital tuning circuit so far described is known in itself (See Funkschau 1976, volume 5, pages 171 et seq. - the circuit described there is used by the Philips company in the "Goya 568 electronic" television apparatus, e.g. type 26 C 568/22Z) and will not be explained in more detail.

In the case of the circuit illustrated in FIG. 1 there is a connecting lead between the store 1 and the counter 2 for every storage bit. Of these leads, for the sake of clarity only a few are drawn viz. 3, 4, 5 and 6. Via this connecting lead there takes place, as indicated by arrows, the reading of the stored code word out of the store 1 into the counter 2. By as many connecting leads, which are indicated by only one connecting lead 7, a code word which is located in the counter and which has been formed there e.g. during tuning to a particular transmitter can be written into a storage place of the store 1. The code word may therefore be transmitted from the counter 1 into the store 2 and conversely from the store 2 into the counter 1. While it is variable in the counter by counting pulses, in the store 1 it is fixedly stored.

For varying the value of the tuning voltage there is located in the connection leads from the store to the counter a binary subtracter known in itself. A suitable subtracter is e.g. described in the book "Binäre Schaltkreise" by the author Walter Wolfgarten, Dr. Alfred Hüthig Verlag, Hiedelberg, 1972. By the subtraction the stored code word is transmitted to the counter 2 in altered form, so that at the output of the D/A converter an altered tuning voltage exists. The direction of alteration is so selected that it effects a frequency adjustment of the tuning oscillator to the fully transmitted sideband. The subtraction may extend over all places of the stored code word. In the case illustrated, however, only the nine bits having the lowest values are altered. The tuned frequency is thereby shifted from point F of the IF pass curve illustrated in FIG. 2 - this value may correspond to the value originally tuned before storing - to the left to the point F'. The point F' is e.g. at the middle of the AFC capturing range. After this reception frequency corresponding to the point F' has been adjusted, the tuning is displaced back to the point F by the AFC circuit, which orientates to the carrier of the received transmitter. In this manner the distance of the tuned reception frequency from the point E, the limit of the AFC capturing range, is increased so that the transmitter is tuned with certainty by the AFC circuit.

The subtracter 8 may in corresponding manner also be arranged in the connecting path 7 from the counter 2 to the store 1. In this case the alteration of the code word would take place before storing. The influence on the tuning voltage would be exactly the same.

Figure 3:
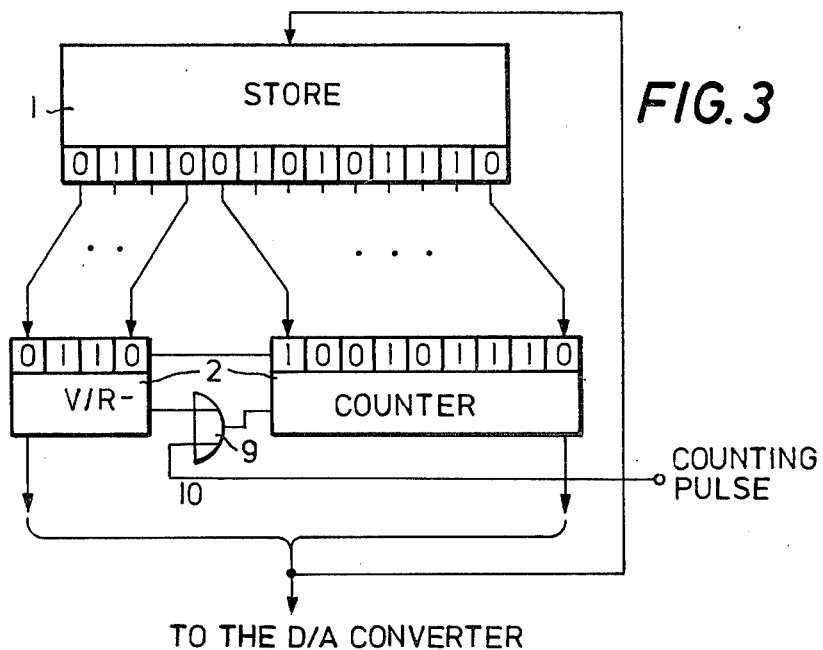
FIG. 3 shows another practical example in which the counting state of a counter, which contains the encoded value of tuning voltage, is varied by counting pulses.

A further practical example is illustrated in FIG. 3. The code word read into the counter 2 or formed in the counter 2 may be altered by counting in a single pulse or a plurality of pulses. For this purpose there is connected in front of the stage into which the pulse is to be counted a CR gate 9 one input of which is connected to the output of the preceding stage of the counter 2, and via the other input 10 of which the single pulse can be counted in. The alteration of the code word may be effected either before the storing or after the calling of a stored code word.

Figure 4:
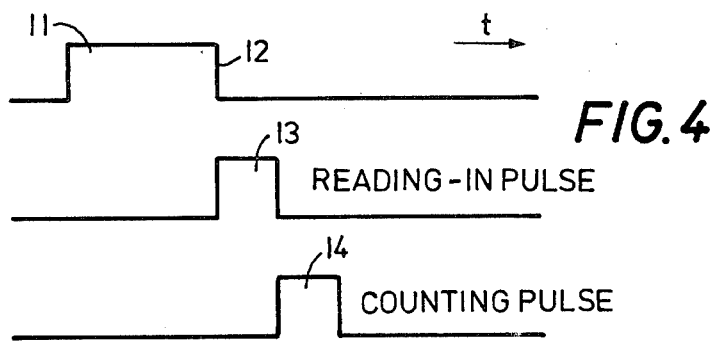
FIG. 4 shows a pulse diagram for the circuit of FIG. 3

In this circuit a control in time is necessary, which is illustrated in FIG. 4. The signal 11 is produced by a transmitter selector button. From the falling edge 12 of the signal 11 is derived a reading pulse 13 by which the transmission of the stored code word into the counter 2 is controlled. From the reading pulse 13 is derived a counting pulse 14, which passes to the input 10 of the CR gate 9 (FIG. 3) and alters the counting state in the manner described. The sequence of reading pulse and counting pulse 2 is to be selected conversely when a code word formed in the counter 2 is to be altered prior to storing. The control pulses may be formed with the aid of monoflops, which are triggered by the falling edge of the preceding pulse. It may be advantageous to select the alteration of the counting state effected by the applied counting pulse 14 to be of a different extent according to the range of reception. For this purpose the counting pulse may be counted into another stage of the counter 2. A corresponding number of CR gates must then be provided.

Figure 5:
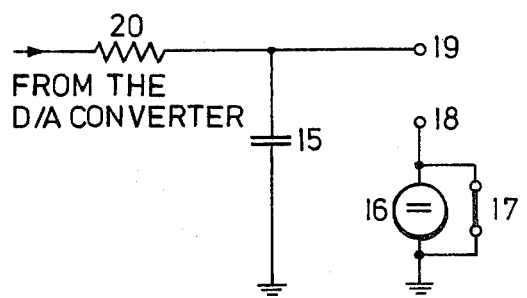
FIG. 5 shows a further practical example in which the direct tuning voltage is varied.

In FIG. 5 is shown how instead of the encoded value of the tuning voltage the analog tuning voltage may be altered. There is shown a filter comprising a resistor 20 and a capacitor 15, which represents the final part of the D/A converter already referred to. Between the output terminals 18 and 19 is the direct tuning voltage. By means of a switch 17, the voltage value of a direct voltage source 16 may be added to the value of the direct tuning voltage or subtracted therefrom according to the basic position of the switch 17. The circuit illustrated in FIG. 5 as a diagram may be formed in practice e.g. as an operational amplifier to one input of which the tuning voltage is applied and the other input of which is connected by electronic means to an auxiliary voltage corresponding to the direct voltage source 16.

What is claimed is:

1. In combination with a high frequency receiving apparatus employing residual sideband modulation wherein the frequencies of the received signals are asymmetrically located with respect to the center frequency of the selection curve of said receiving apparatus; a tuning circuit comprising digital storage means for storing an encoded voltage corresponding to a selected one of said asymmetrically located frequencies, a counter for generating an encoded tuning voltage, and a digital-to-analog converter having an input coupled to the input of said storage means and the output of said counter for generating an analog voltage corresponding to the encoded tuning voltage at the output of said counter; wherein the improvement comprises digital circuit means coupled to said counter for shifting said analog voltage to a value corresponding to a frequency closer to said center frequency than said selected asymmetrically located frequency, said receiver being tuned to said selected frequency by fine tuning means.

2. The tuning circuit defined by claim 1 wherein said digital circuit means is located between the output of said storage means and the input of said counter, said stored encoded voltage being transmitted in altered form to said digital-to-analog converter.

3. The tuning circuit defined by claim 1 wherein said digital circuit means alters the voltage at the output of said counter prior to its being written into said storage means.

4. The tuning circuit defined by claims 1, 2 or 3 wherein said digital circuit means is a binary subtracter circuit.

5. The tuning circuit defined by claims 1, 2 or 3 wherein said counter is divided into first and second stages into which the encoded voltage stored in said storage means is read, and wherein said digital circuit means couples externally applied counting pulses into said counter.

6. The tuning circuit defined by claim 5 wherein said digital circuit means comprises a CR gate having a first input coupled to an output of the first stage of said counter, a second input for receiving said externally applied counting pulses and an output coupled to an input of the second stage of said counter.

7. The tuning circuit defined by claim 1 which further comprises means for selectively altering the voltage at the output of said digital-to-analog counter.

8. The tuning circuit defined by claim 7 wherein said means for selectively altering the voltage at the output of said digital-to-analog counter comprises a direct voltage source and means for switching said direct voltage source in series with the output of said digital-to-analog converter.

* * * * *